(12) United States Patent
Murai

(10) Patent No.: US 6,987,349 B2
(45) Date of Patent: Jan. 17, 2006

(54) PIEZOELECTRIC THIN FILM ELEMENT, MANUFACTURING METHOD THEREOF, AND LIQUID EJECTING HEAD AND LIQUID EJECTING APPARATUS EMPLOYING SAME

(75) Inventor: Masami Murai, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 3 days.

(21) Appl. No.: 10/256,260

(22) Filed: Sep. 27, 2002

(65) Prior Publication Data

US 2003/0076007 A1    Apr. 24, 2003

(30) Foreign Application Priority Data

Sep. 28, 2001  (JP)  ............... 2001-303672
Jul. 12, 2002  (JP)  ............... 2002-204576

(51) Int. Cl.
*H01L 41/08* (2006.01)

(52) U.S. Cl. ..................... 310/332; 310/332

(58) Field of Classification Search ............ 310/328, 310/311, 363, 324, 359, 330–332, 366
See application file for complete search history.

(56) References Cited

U.S. PATENT DOCUMENTS 6,142,615 A *  11/2000  Qiu et al. ............ 347/70
6,294,860 B1 *  9/2001  Shimada et al. ........ 310/328
6,347,441 B1 *  2/2002  Yun et al. ............. 29/25.35
6,373,461 B1 *  4/2002  Hasegawa et al. ...... 345/107
2002/0130929 A1   9/2002  Mural ................. 347/70

FOREIGN PATENT DOCUMENTS

| EP | 1 137 078 A2 | 9/2001 |
|---|---|---|
| JP | 9-331067 | 12/1997 |
| JP | 10-287468 | 10/1998 |
| JP | 11-238920 | 8/1999 |
| JP | 11-284242 | 10/1999 |

OTHER PUBLICATIONS

Sumi Koji, "Piezielectric Thin Film, Its Production, Piezoelectric Element, and Ink Jet Printer Head", *Patent Abstracts of Japan*, Publication No. 10-287468, Oct. 27, 1998, 8 pages.

(Continued)

*Primary Examiner*—Mark Budd
(74) *Attorney, Agent, or Firm*—Sterne, Kessler, Goldstein & Fox P.L.L.C.

(57) ABSTRACT

The present invention provides a piezoelectric thin film element with superior piezoelectric properties in which the condition of the crystal of the piezoelectric thin film is appropriately controlled, and a manufacturing method thereof, as well as a inkjet recording head, inkjet printer, or other liquid ejecting apparatus employing the same. The piezoelectric thin film element 40 comprises a top electrode 44, a bottom electrode 42, and a piezoelectric thin film 43 formed between the top electrode 44 and the bottom electrode 42, wherein the piezoelectric thin film 43 is structured so as to comprise a first layer 431 located nearest to the bottom electrode and second layers (433–436) that are located nearer to the top electrode than the first layer and that have thicknesses greater than that of the first layer 431.

9 Claims, 10 Drawing Sheets

OTHER PUBLICATIONS

Endo Toshiya, "Piezoelectric Thin Film and Its Manufacture", *Patent Abstracts of Japan*, Publication No. 11-284242, Oct. 15, 1999, 2 pages.

Uchida Shinji et al., "Piezoelectric Element and Its Manufacture", *Patent Abstracts of Japan*, Publication No. 09331087, Dec. 22, 1997, 1 pg.

Oka Hiroshi et al., "Piezoelectric Element, and Ink Jet Type Recorder Head and Manufacture Thereof", *Patent Abstracts of Japan*, Publication No. 11-238920, Aug. 31, 1999, 2 pages.

* cited by examiner

PIEZOELECTRIC THIN FILM ELEMENT, MANUFACTURING METHOD THEREOF, AND LIQUID EJECTING HEAD AND LIQUID EJECTING APPARATUS EMPLOYING SAME

BACKGROUND OF THE INVENTION

1. Field of the Invention

The present invention relates to a piezoelectric thin film element, a manufacturing method thereof, and a liquid ejecting head and liquid ejecting apparatus employing the same, and more particularly to a piezoelectric thin film element or the like with superior piezoelectric properties and productivity.

2. Description of the Related Art

Piezoelectric thin film elements that employ piezoelectric thin films that contain crystals typified by PZT (lead zirconate titanate; $Pb(Zr_xTi_{1-x})O_3$) have functions such as spontaneous polarization, high permittivity, electro-optic effects, piezoelectric effects, and pyroelectric effects, and are applied in extensive device development.

A piezoelectric thin film element is structured by sequentially stacking a substrate, a diaphragm, a bottom electrode, a piezoelectric thin film, and a top electrode. Since piezoelectric properties of a piezoelectric thin film vary according to the condition of the crystal (such as the orientation of the crystal that makes up the film), the condition of the crystal must be controlled when the piezoelectric thin film is formed.

Possible methods of forming a piezoelectric thin film include sputtering, sol-gel processes, CVD, laser ablation, and the like, but sol-gel processes, which form a film by sol application, drying, pyrolyzing and annealing, are superior for controlling the condition of the crystal.

Such piezoelectric thin films are known to have superior piezoelectric properties when comprising a PZT fine crystal film with a high degree of orientation.

In conventional practice, PZT crystal films composed of stacked material comprising a plurality of thin layers have been suggested for obtaining a PZT fine crystal film.

However, using stacked material comprising a plurality of thin layers for the PZT crystal film has disadvantages in that the number of layers must be increased in order to obtain the desired thickness, increasing the number of processes for forming the layers and decreasing productivity. Due to the increase in the number or processes for forming the layers, there is also a possibility that chances will increase for contaminants such as waste to get mixed inside the film, causing the risk of reduced reliability for the piezoelectric thin film element.

SUMMARY OF THE INVENTION

Therefore, an object of the present invention is to provide a piezoelectric thin film element with superior piezoelectric properties in which the condition of the crystal of the piezoelectric thin film is appropriately controlled and a manufacturing method thereof, as well as a liquid ejecting head and liquid ejecting apparatus that employ the same.

As a result of extensive research, the inventor developed the present invention upon discovering that a piezoelectric thin film element with superior piezoelectric properties can be obtained without affecting productivity or reliability by reducing the thickness during annealing of a first layer located nearest to a bottom electrode, and by providing a second layer whose thickness is greater than that of the first layer to a top electrode during annealing.

The piezoelectric thin film element according to the present invention comprises a top electrode, a bottom electrode, and a piezoelectric thin film formed between the top electrode and the bottom electrode, wherein the piezoelectric thin film comprises a plurality of layers, and the plurality of layers comprises a first layer located nearest to the bottom electrode, and a second layer that is located nearer to the top electrode than the first layer and that has a thickness greater than that of the first layer. In the piezoelectric thin film element, the bottom electrode is patterned in a specific configuration on a diaphragm; the piezoelectric thin film is formed both on the bottom electrode remained after the patterning and on the diaphragm from which the bottom electrode has been removed; and the portion of the piezoelectric thin film on the bottom electrode remained after the patterning has a greater number of layers than the portion on the diaphragm from which the bottom electrode has been removed.

Using such a structure makes it possible to obtain a piezoelectric thin film element with superior piezoelectric properties without affecting productivity or reliability.

The thickness of the first layer is preferably between 10 nm and 100 nm, and is more preferably between 20 nm and 50 nm. Productivity, reliability, and piezoelectric properties can be more effectively preserved when the thickness of the first layer located nearest to the bottom electrode is within this range.

The thickness of the second layer is preferably between 100 nm and 300 nm, and is more preferably between 150 nm and 200 nm. Productivity, reliability, and piezoelectric properties can be more effectively preserved when the thickness of the second layer is within this range.

The thickness of the entire piezoelectric thin film is preferably between 0.5 µm and 1.5 µm.

The first layer is preferably composed of a PZT crystal having a rhombohedral crystal structure and a lattice constant of 4.070 Å or less. Having such a crystal structure makes it possible to obtain better piezoelectric properties and to produce a superior piezoelectric thin film element.

The PZT crystal is preferably a crystal comprising a solid solution of any one of the following groups: lead titanate and lead zirconate; lead titanate, lead zirconate and lead magnesium niobate; lead titanate, lead zirconate and lead zincate niobate; or lead titanate, lead zirconate and lead nickelate niobate.

A degree of orientation in (100) plane of the PZT crystal is preferably 70% or greater in the thickness direction of the piezoelectric thin film. The (100) plane degree of orientation is calculated from $I(100)/\Sigma I(hkl)$ by analyzing the diffraction strength (I) obtained by wide-angle X-ray diffraction. $\Sigma I(hkl)$ is the sum of all the diffraction strengths of the (100) plane, the (110) plane, and the (111) plane obtained using the CuKα line. Having such a crystal structure makes it possible to obtain better piezoelectric properties and to produce a superior piezoelectric thin film element.

In a preferred embodiment, the bottom electrode is patterned in a specific configuration on a diaphragm, and the piezoelectric thin film is formed both on the bottom electrode remained after the patterning and on the diaphragm from which the bottom electrode has been removed by the patterning, such that the portion of the piezoelectric thin film located on the bottom electrode remained after the patterning has a greater number of layers than the portion located on the diaphragm from which the bottom electrode has been removed.

The liquid ejecting head according to the present invention comprises the above-mentioned piezoelectric thin film element as a piezoelectric actuator for ejecting liquid.

The liquid ejecting apparatus according to the present invention comprises the above-mentioned liquid ejecting head.

The method of manufacturing a piezoelectric thin film element according to the present invention comprises the steps of forming a bottom electrode on a substrate; forming a piezoelectric thin film on the bottom electrode by a sol-gel process; and forming a top electrode on the piezoelectric thin film. In this method, the step of forming the piezoelectric thin film comprises the steps of (a) applying a sol onto the bottom electrode and then performing drying and pyrolyzing to form a first precursor layer; (b) annealing the first precursor layer by heating from the substrate side to form a first layer of the piezoelectric thin film; (c) applying the sol onto the first layer and then performing drying and pyrolyzing to form a second precursor layer; and (d) annealing the second precursor layer by heating from the substrate side to form a second layer whose thickness is greater than that of the first layer.

Reducing the thickness of the first precursor layer initially formed on the bottom electrode and reducing the thickness during annealing makes it possible to appropriately anneal the first layer and to obtain a fine crystal film with a high (100) plane degree of orientation. Making the thickness of the second layer (which is formed above the first layer) greater than the thickness of the first layer improves productivity. Since each layer formed above the first layer is formed while being sequentially crystallized in accordance with the condition of the crystal of the first layer having a fine crystal structure, the layers form a thin film comprising fine crystals even though thickness during annealing is increased. Consequently, according to the present manufacturing method, a piezoelectric thin film element with superior piezoelectric properties can be obtained without affecting productivity or reliability.

In the above-mentioned manufacturing method, the second precursor layer is preferably formed by applying the sol onto the first layer and performing drying and pyrolyzing, and then again applying the sol thereon and performing drying and pyrolyzing.

Specifically, the first layer located nearest to the bottom electrode is formed by a sequence of steps of sol application, drying, pyrolyzing and annealing. The second layer is formed on the first layer by repetition of sol application, drying and pyrolyzing to form the second precursor layer, and by annealing the second precursor layer. This makes it possible to manufacture a piezoelectric thin film element with superior piezoelectric properties without affecting productivity or reliability.

The above-mentioned manufacturing method preferably has another step of forming a Ti thin film on the bottom electrode, wherein the first precursor layer is formed by applying the sol to the bottom electrode via the Ti thin film and then performing drying and pyrolyzing The step of forming the piezoelectric thin film further comprise a step of patterning the first layer and the bottom electrode after forming the first layer and before forming the second precursor layer. In this case, the second precursor layer is formed by applying the sol both onto the first layer remained after the patterning and onto the substrate from which the bottom electrode has been removed.

The above-mentioned manufacturing method further comprises a step of forming a Ti thin film with a thickness of between 1 nm and 4 nm on the patterned first layer before forming the second precursor layer.

The method of manufacturing the liquid ejecting head of the present invention comprises the steps of forming a piezoelectric thin film element by the above-mentioned methods, etching the substrate to form a pressure chamber, and forming a nozzle plate covering the pressure chamber.

DESCRIPTION OF THE PREFERRED EMBODIMENTS

Embodiments of the present invention are described below with reference to the figures. The present invention is by no means limited thereby.

1. Entire Structure of Inkjet Printer

Figure 1:
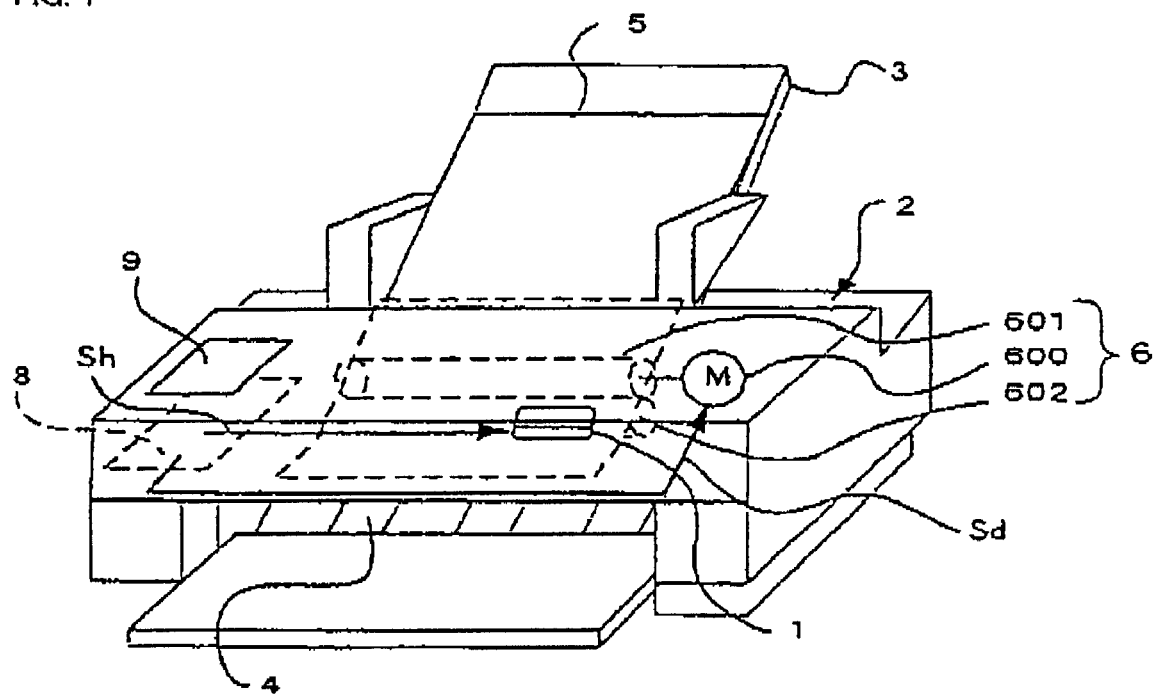
FIG. 1 is a perspective view of an example of an inkjet printer, which is a liquid ejecting apparatus of the present invention.

FIG. 1 shows a perspective view of an example of an inkjet printer, which is a liquid ejecting apparatus of the present invention. The printer comprises a main body 2, a tray 3, a release opening 4, and an operating button 9.

The main body 2 is the case of the printer, and comprises a feeding mechanism 6 positioned to be able to supply paper 5 from the tray 3, and disposed therein is an inkjet recording head 1, which is a liquid ejecting head, so as to be able to print on the paper 5. A control circuit 8 is provided to the interior of the main body 2.

The tray 3 is structured so as to be able to supply the paper 5 to the feeding mechanism 6 before printing, and the release opening 4 is an opening for releasing the paper 5 after printing is complete.

The inkjet recording head 1 comprises the piezoelectric thin film element according to the present invention, and is structured so as to be able to ejecting ink or other liquid from the nozzle according to a signal Sh outputted from the control circuit 8.

The feeding mechanism 6 comprises a motor 600 and rollers 601 and 602. The motor 600 rotates according to the signal Sh outputted from the control circuit 8, this rotational force is transmitted to the rollers 601 and 602, and the paper 5 set on the tray 3 is pulled in by the rotations of the rollers 601 and 602 and is supplied to be printed by the head 1.

The control circuit 8 comprises a CPU, ROM, RAM, an interface circuit, and the like (not shown). According to the printing information supplied from the computer via a connector (not shown), the control circuit 8 outputs a signal to the feeding mechanism 6 or a drive mechanism of the head 1.

2. Structure of Inkjet Recording Head

Figure 2:
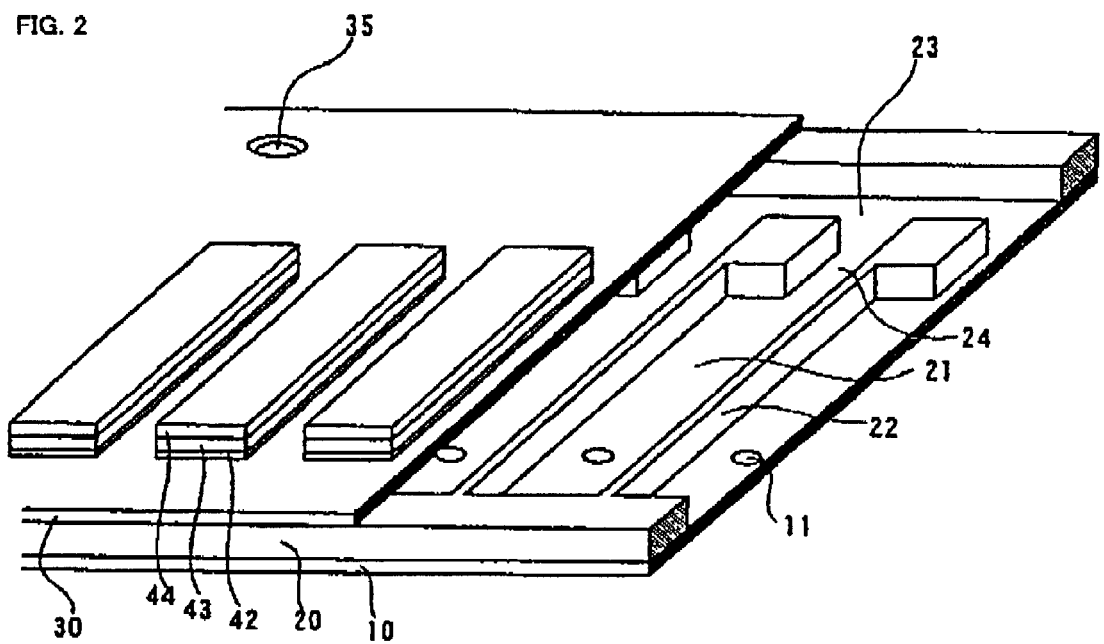
FIG. 2 is an exploded perspective view of an example of an inkjet recording head, which is a liquid ejecting head of the present invention.

FIG. 2 shows an exploded perspective view of an example of an inkjet recording head, which is a liquid ejecting head of the present invention.

The head is composed of a nozzle plate 10, a pressure chamber substrate 20, a diaphragm 30, a bottom electrode 42, a piezoelectric thin film 43, and a top electrode 44.

The pressure chamber substrate 20 comprises a pressure chamber 21, a side wall 22, a reservoir 23, and a supplying opening 24. By etching silicon or other substrate, the pressure chamber 21 is formed as a storage space for ejecting ink or other liquid. The side wall 22 is formed so as to partition off the pressure chamber 21. The reservoir 23 functions as a common flow conduit for supplying ink to each pressure chamber 21 via the supplying opening 24.

The nozzle plate 10 is affixed to one side of the pressure chamber substrate 20 such that a nozzle 11 is disposed in a location corresponding to each pressure chamber 21 provided to the pressure chamber substrate 20.

The pressure chamber 21 and the nozzle 11 are structured to be connected at a predetermined pitch. The nozzle pitch can be variably designed as needed according to printing accuracy, and may, for example, be set at 400 dpi (dots per inch).

The bottom electrode 42, the piezoelectric thin film 43, and the top electrode 44 are provided to the top surface of the diaphragm 30 at positions corresponding to each pressure chamber 21, arid function as a piezoelectric actuator. An ink tank inlet 35 is provided to the diaphragm 30, which makes it possible to supply ink stored in the ink tank (not shown) to the reservoir 23 of the pressure chamber substrate 20.

3. Layer Structure of First Embodiment

Figure 3:
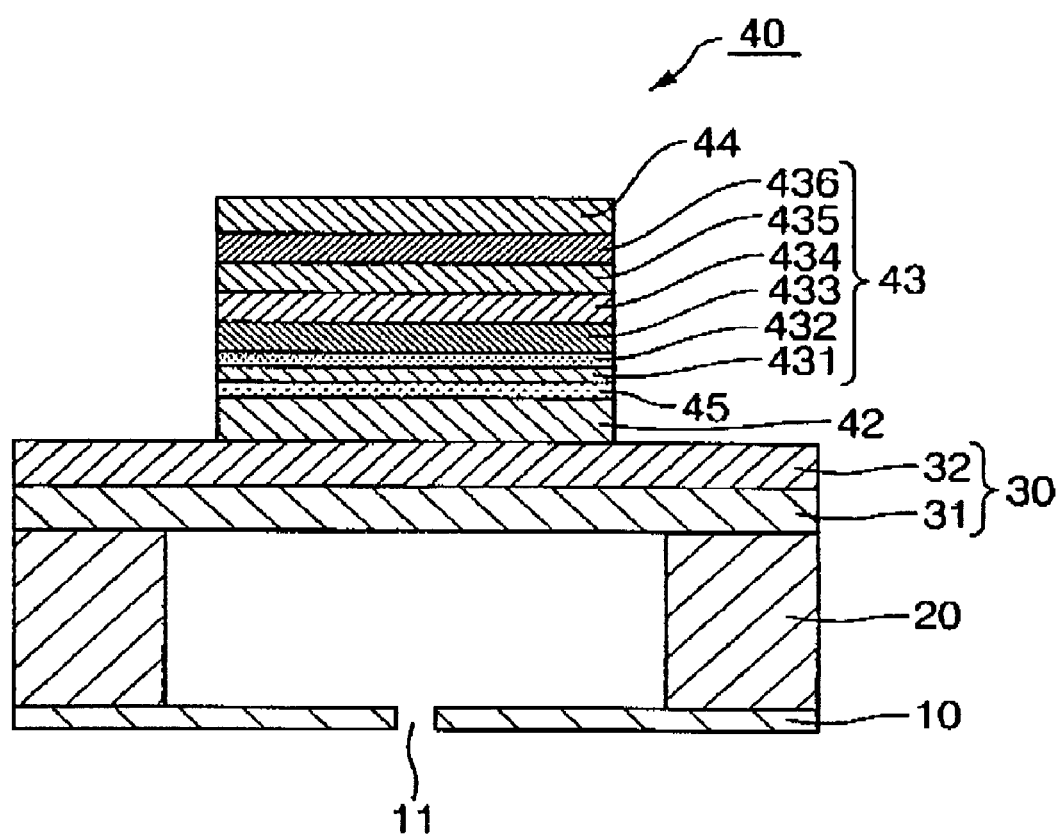
FIG. 3 is an enlarged cross-sectional view of a liquid ejecting head according to a first embodiment of the present invention.

FIG. 3 shows an enlarged cross-sectional view of a liquid ejecting head according to a first embodiment of the present invention. As shown in FIG. 3, the piezoelectric thin film element 40 is structured by stacking the diaphragm 30 on top of the pressure chamber substrate 20 with the nozzle plate 10, and sequentially stacking thereon the bottom electrode 42, the seed Ti film 45, the piezoelectric thin film 43, and the top electrode 44.

A silicon single crystal substrate with a thickness of 220 μm is preferably used as the pressure chamber substrate 20.

Films of silicon dioxide, zirconium oxide, tantalum oxide, silicon nitride, aluminum oxide, and the like are suitable for the diaphragm 30. In particular, it is preferable to stack together an $SiO_2$ film 31 having silicon dioxide ($SiO_2$) formed on the pressure chamber substrate 20, and a $ZrO_2$ film 32 having zirconium oxide ($ZrO_2$) formed on the $SiO_2$ film 31.

The bottom electrode 42 is preferably formed by a single layer of iridium, a single layer of platinum, a single film layer of an alloy of iridium and platinum; or a stacked configuration comprising iridium layer/platinum layer, platinum layer/iridium layer, or iridium layer/platinum layer/iridium layer.

A seed Ti film 45 is formed on the bottom electrode 42. Forming the seed Ti film 45 makes it possible to control the orientation of the piezoelectric thin film 43 formed thereon. The seed Ti film 45 preferably has a thickness between 3 nm and 10 nm, and more preferably 5 nm. It is also acceptable for the seed Ti film to be island shaped and not to have uniform thickness.

An appropriate buffer layer of an ultra thin titanium film or chromium film or the like may be interposed between the diaphragm 30 and the bottom electrode 42 in order to further improve adhesion between the two. A thickness of 10 nm or more but 20 nm or less is suitable for the titanium thin film.

The piezoelectric thin film 43 is structured by stacking six layers: the first layer 431 located nearest to the bottom electrode, and layers 432, 433, 434, 435, and 436 formed sequentially thereon toward the top electrode. The thickness of the first layer 431 is preferably between 10 nm and 100 nm. The thicknesses of the layers 432–436 are greater than that of the first layer 431, preferably between 100 nm and 300 nm. The entire thickness of the piezoelectric thin film 43 is preferably between 0.5 μm and 1.5 μm.

The first layer 431 is preferably structured from a PZT crystal having a rhombohedral crystal structure with a lattice constant of 4.070 Å or less. This PZT crystal also preferably has a degree of orientation in (100) plane of 70% or greater in the thickness direction of the piezoelectric thin film.

The first layer 431 and the layers 432–436 preferably comprise lead titanate ($PbTiO_3$), lead zirconate ($PbZrO_3$), lead zirconate titanate ($Pb(Zr,Ti)O_3$), lead lanthanum titanate (($Pb,La)TiO_3$), lead magnesium niobate ($Pb(Mg, Nb)O_3$), lead lanthanum zirconate titanate (($Pb,La$) ($Zr, Ti)O_3$), lead magnesium niobate zirconium titanate ($Pb(Zr, Ti$) $(Mg,Nb)O_3$), or the like. Particularly, the following solid solutions are preferred: lead titanate ($PbTiO_3$) and lead zirconate ($PbZrO_3$); lead titanate ($PbTiO_3$), lead zirconate ($PbZrO_3$), and lead magnesium niobate ($Pb(Mg,Nb)O_3$); lead titanate ($PbTiO_3$), lead zirconate ($PbZrO_3$), and lead zincate niobate ($Pb(Zn,Nb)O_3$) ; or lead titanate ($PbTiO_3$), lead zirconate ($PbZrO_3$), and lead nickelate niobate ($Pb(Ni, Nb)O_3$), The top electrode 44 is not particularly limited so long as it consists of conductive material capable of being used as a common electrode, and may, for example, be a single-layer film of Pt, $RuO_2$, Ir, $IrO_2$, or the like, or a stacked film of two or more layers consisting of Pt/Ti, Pt/Ti/TiN, Pt/TiN/Pt, Ti/Pt/Ti, TiN/Pt/TiN, Pt/Ti/TiN/Ti, $RuO_2$/TiN, $IrO_2$/Ir, $IrO_2$/TiN, or the like.

4. Printing Operation

Printing operation of the above-mentioned inkjet recording head is described below. When a drive signal is outputted from the control circuit, paper is fed by operation of the paper feeder to a position where it can be printed on by the head. When an ejecting signal is not supplied from the control circuit and drive voltage is not applied between the bottom electrode and the top electrode of the piezoelectric element, no variation occurs in the piezoelectric thin film layer. Pressure variations do not occur in a pressure chamber provided with a piezoelectric element to which an ejecting signal is not applied, and no ink droplets are ejected from the nozzle.

When an ejecting signal is supplied from the control circuit and a predetermined drive voltage is applied between the bottom electrode and the top electrode of the piezoelectric element, the piezoelectric thin film layer is deformed. The diaphragm bends greatly in a pressure chamber provided with a piezoelectric element to which an ejecting signal is supplied. Therefore, pressure is instantaneously increased in the pressure chamber and ink droplets are ejected from the nozzle. Any characters or graphics can be printed by individually supplying ejecting signals to the piezoelectric element in a position corresponding to visual data in the head.

5. Manufacturing Method of First Embodiment

Figure 4:
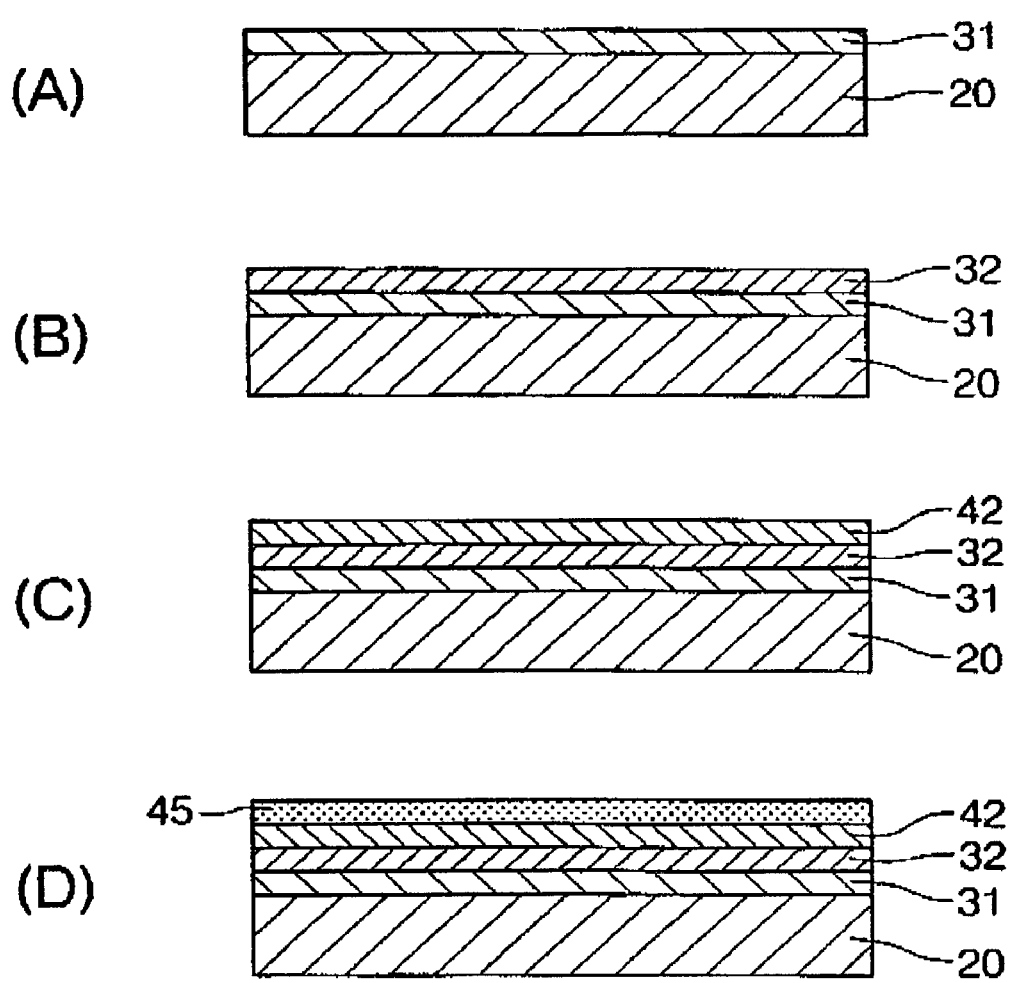
FIG. 4 is a cross-sectional view showing a production process of a liquid ejecting head according to the first embodiment.

Next, the steps for manufacturing the piezoelectric thin film element according to the first embodiment will be described with reference to FIGS. 4 through 6.

Step of Forming the Diaphragm

First, as shown in FIG. 4(A), an $SiO_2$ film 31 with a thickness of about 1 $\mu$m is formed on the pressure chamber substrate 20 consisting of silicon by thermal oxidation, CVD, or other film forming methods.

Next, as shown in FIG. 4(B), a barrier layer 32 comprising a $ZrO_2$ film is formed on the $SiO_2$ film 31. Sol-gel processes, reactive sputtering by introduction of oxygen gas with zirconium as a target, RF sputtering with zirconium oxide as a target, thermal oxidation following formation of a zirconium film by DC sputtering, ion implantation, and the like are used as methods for forming the barrier layer 32.

Step of Forming Bottom Electrode

Next, as shown in FIG. 4(C), a bottom electrode 42 comprising Pt or the like is formed on the diaphragm. CVD, electron beam vapor deposition, sputtering, or other methods are used to form the bottom electrode 42. For example, a platinum layer with a thickness of 200 nm is formed. Or, a platinum layer with a thickness of 100 nm is formed and then an iridium layer with a thickness of 100 nm is formed thereon.

Step of Forming Seed Ti Film

Next, as shown in FIG. 4(D), a seed Ti film 45 is formed on the bottom electrode 42 using DC magnetron sputtering, CVD, vapor deposition, or other film forming methods. The thickness of the seed Ti film 45 is preferably between 3 nm and 10 nm. This seed Ti film preferably has nonuniform thickness and is island-shaped.

Step of Forming Piezoelectric Thin Film

Figure 5:
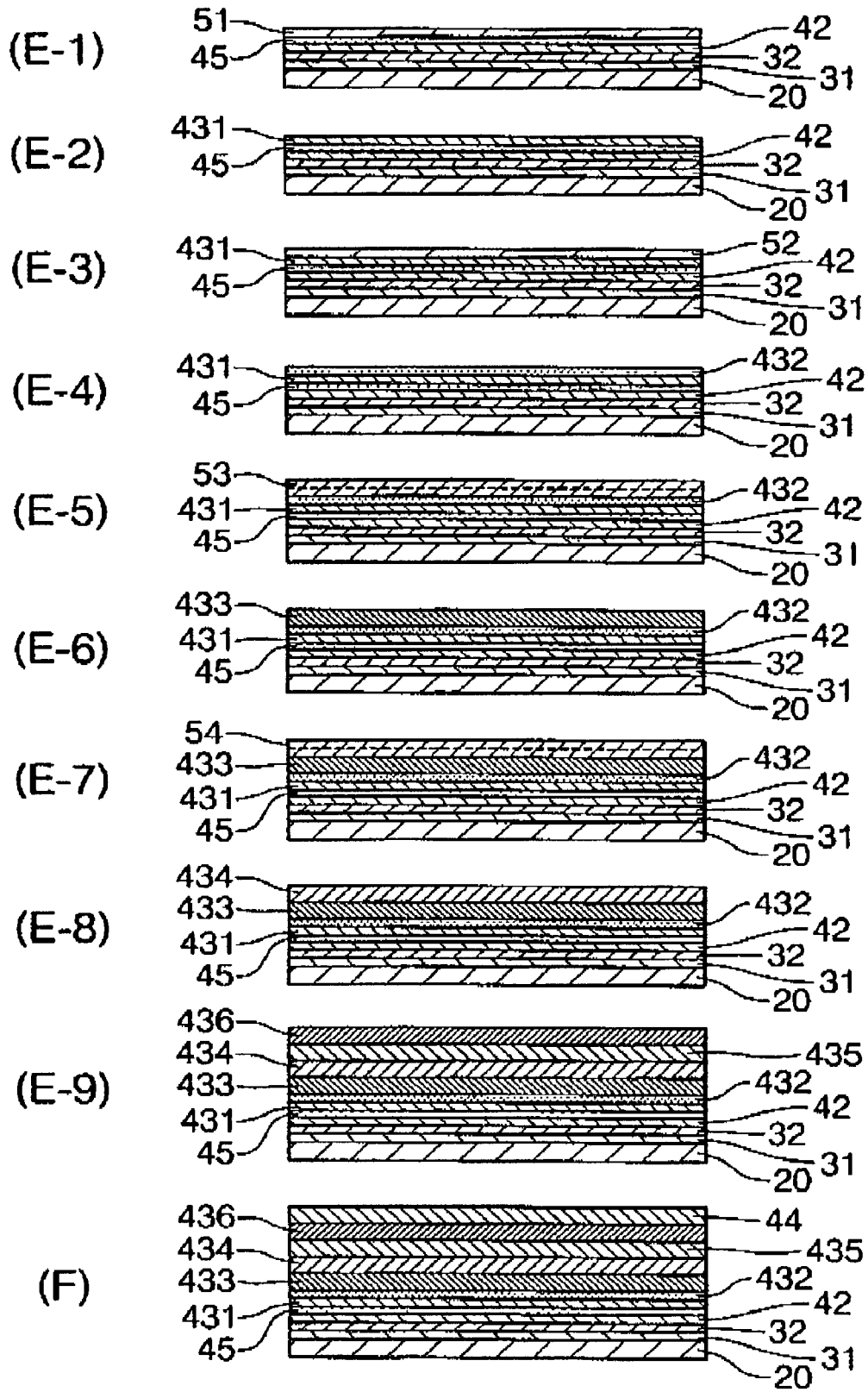
FIG. 5 is a cross-sectional view showing the production process of the liquid ejecting head according to the first embodiment.
Figure 6:
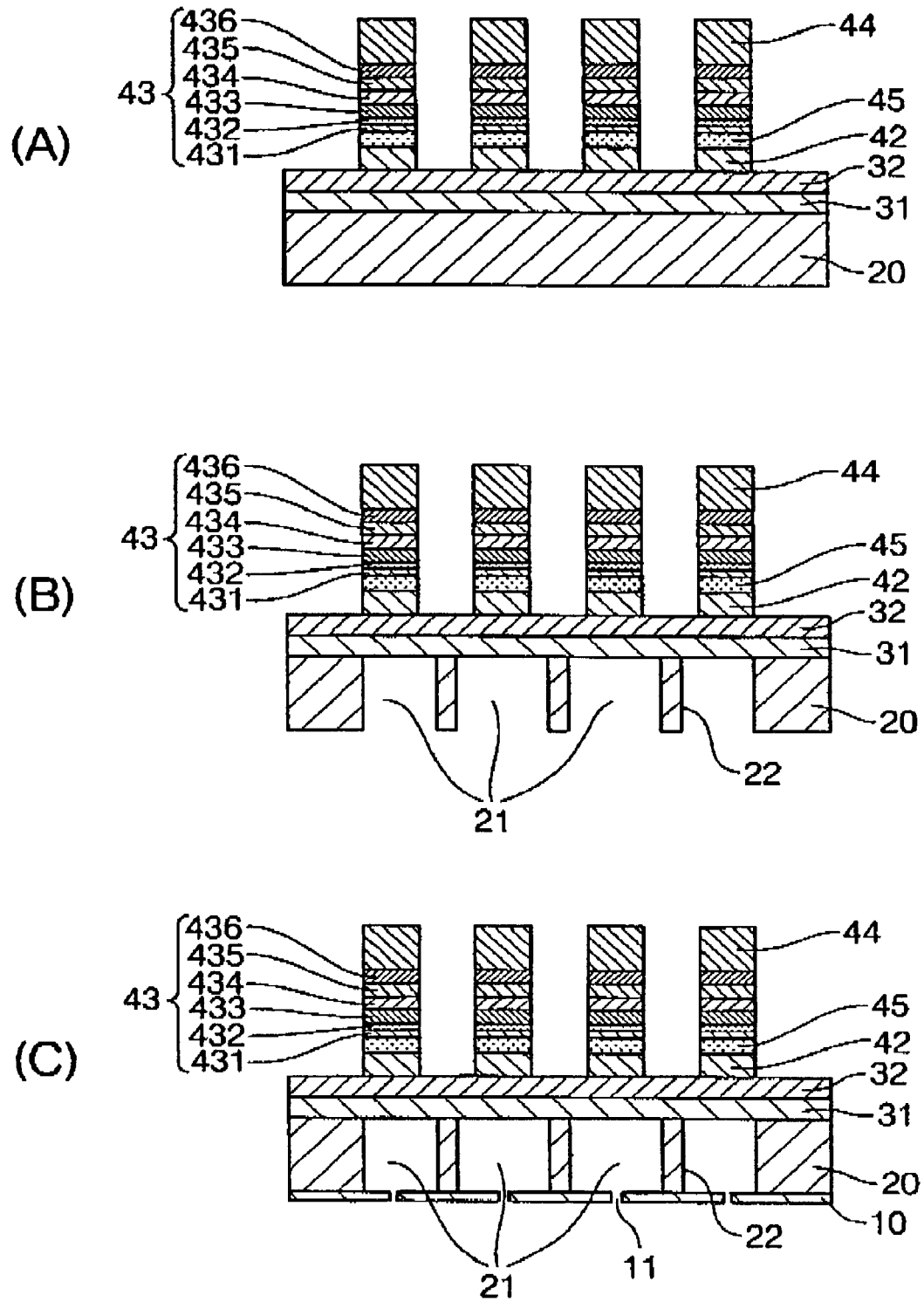
FIG. 6 is a cross-sectional view showing the production process of the liquid ejecting head according to the first embodiment.

Next, as shown in FIGS. 5(E-1) through (E-9), a piezoelectric thin film 43 is formed on the seed Ti film 45 by a sol-gel process. The sol-gel process involves converting a hydrated complex of a metal hydroxide (sol) into gel by dehydration, and annealing the gel to form an inorganic oxide film. When a sol-gel process is used, the PZT crystal grows upward from the side of the seed Ti film 45 provided to the bottom electrode 42, allowing the orientation of the PZT crystal to be adequately controlled.

When the piezoelectric thin film 43 is formed using a sol-gel process, the sol is first prepared by using acid or the like to hydrolyze acetate compounds or alkoxides such as methoxides, ethoxides, propoxides, or butoxides of titanium, zirconium, lead, zinc, or other metals.

Next, as shown in FIG. 5(E-1), the sol is applied on the seed Ti film 45. Spin coating, dip coating, roll coating, bar coating, flexographic printing, screen printing, offset printing, or other methods are used to apply the sol. After the sol is applied, it is dried for a predetermined time period below a predetermined temperature, and the sol solvent is evaporated. The drying temperature is preferably between 150° C. and 200° C., and the drying time is preferably between 5 and 15 minutes. After drying, a first precursor layer 51 is formed by pyrolyzing for a predetermined amount of time at a predetermined pyrolyzing temperature in atmospheric conditions. The pyrolyzing temperature is preferably between 300° C. and 500° C. The pyrolyzing time is preferably between 5 and 90 minutes. Organic material coordinated to the metal is dissociated from the metal by pyrolyzing, an oxidative reaction is initiated, and the organic material is scattered into the atmosphere.

Next, as shown in FIG. 5(E-2), the first precursor layer 51 is annealed by heating from the substrate side, and the layer is crystallized, yielding the first layer 431. Since the thickness of the first precursor layer 431 is reduced and annealing is performed by heating from the substrate side, adequate annealing can be achieved, and it is possible to obtain the first layer 431 comprising a crystallized film with a lattice constant of 4.070 Å or less and a (100) plane degree of orientation of 70% or greater. The annealing temperature is preferably between 600° C. and 800° C. Setting the annealing temperature at 600° C. or greater makes it possible to obtain a piezoelectric thin film with superior piezoelectric properties, and at 800° C. or less it is possible to suppress diffusion of the lead and to prevent unnecessary oxidation of the bottom electrode. RTA (Rapid Thermal Annealing) apparatus or diffusion furnace or the like is used for annealing.

Similarly, as shown in FIGS. 5(E-3) and (E-4), the sol is applied onto the first layer 431, and drying and pyrolyzing are sequentially conducted to yield a precursor layer 52, which is annealed to form a layer 432. Since the layer 432 is formed while being sequentially crystallized in accordance with the crystal condition of the first layer 431 having a fine crystal structure, a fine crystal similar to the first layer 431 can be obtained.

Next, as shown in FIGS. 5(E-5) and (E-6), the sol is applied onto the layer 432, the layer is dried and pyrolyzed, the sol is again applied thereon, and the resulting layer is dried and pyrolyzed to form a precursor layer 53, which is annealed by heating from the substrate side, yielding a layer 433. Similarly, as shown in FIGS. 5(E-7) and (E-8), the steps of sol application, drying, and pyrolyzing are repeated twice to form a precursor layer 54, which is annealed by heating from the substrate side, yielding a layer 434. Similarly, as shown in FIG. 5(E-9), layers 435 and 436 are sequentially formed. The layers 433 through 436 are formed with thicknesses larger than that of the first layer 431. A piezoelectric thin film 43 having six layers is thus formed. The layers 433 through 436 have thicknesses greater than that of the first layer, but since they are formed while being sequentially crystallized in accordance with the crystal condition of the lower layer having a fine crystal structure, a fine crystal similar to the first layer 431 can be obtained.

The present invention is not limited to the present embodiment, and it is acceptable to reduce the thickness of the precursor layer 51 of the first layer 431 located nearest to the bottom electrode, as it is for the second layer (the layers 433–436 are equivalent to the second layer in the present embodiment) to be obtained by annealing the second precursor layer, whose thickness is greater than that of the first precursor layer 51. Specifically, a layer obtained by annealing a precursor layer whose thickness is less than that of the first precursor layer 51 may be included above the first layer (between the first and second layers, or above the second layer). The present invention is not limited to cases in which six layers are stacked in the above-described manner.

Step of Forming Top Electrode

As shown in FIG. 5(F), the top electrode 44 is formed on the piezoelectric thin film 43 obtained as described above. For example, DC sputtering may be used to form a film of iridium with a thickness of 100 nm.

Etching Step

Next, as shown in FIG. 6(A), the top electrode 44 is spin-coated with a resist and patterned by being exposed or developed at a location at which the pressure chamber is to be formed. Using the remaining resist as a mask, the top electrode 44, the piezoelectric thin film 43, the seed Ti film 45, and the bottom electrode 42 are etched by ion milling, dry etching, or other methods.

Step of Forming Pressure Chamber

Next, as shown in FIG. 6(B), an etching mask is provided to a location at which the pressure chamber is to be formed, and the pressure chamber substrate 20 is etched to a predetermined depth by parallel-plate reactive ion etching or other dry etching methods that use active gas, yielding a pressure chamber 21. The remaining portion that was not dry-etched forms the side wall 22.

Step of Bonding the Nozzle Plate

Finally, as shown in FIG. 6(C), the nozzle plate 10 is bonded to the pressure chamber substrate 20 using an adhesive agent. In the process, each nozzle 11 is positioned so as to be disposed corresponding to the spaces of the pressure chambers 21. The pressure chamber substrate 20, to which the nozzle plate 10 is bonded, is attached to the case (not shown), completing the inkjet recording head.

(Embodiment 1)

A piezoelectric thin film element was manufactured according to the manufacturing method of the present embodiment. Specifically, an $SiO_2$ film with a thickness of 1 $\mu$m was first formed by thermal oxidation on a pressure chamber substrate having a thickness of 200 $\mu$m and consisting of silicon, and a $ZrO_2$ film with a thickness of 400 nm was formed thereon by reactive sputtering. Next, a platinum film with a thickness of 100 nm was formed by CVD, and an iridium film with a thickness of 100 nm was then formed by CVD, yielding a bottom electrode. A seed Ti film with a thickness of 5 nm was then formed on the bottom electrode by DC magnetron sputtering.

A two-component sol, comprising a mixed solution of $PbTiO_3$ and $PbZrO_3$, was prepared as a starting material for the PZT film.

The sol was applied in a thickness of 10 nm by spin coating at 1500 rpm to the seed Ti film. The coated film was dried for 10 minutes at 180° C. and then pyrolyzed for 60 minutes at 400° C., yielding a first precursor layer. This first precursor layer was annealed and crystallized by heating from the substrate side for 5 minutes at an annealing temperature of 650° C., yielding a first layer.

Next, the sol was applied in a thickness of 100 nm by spin coating at 1500 rpm, and the coating was dried, pyrolyzed, and annealed as described above.

Next, the sol was applied in a thickness of 100 nm by spin coating at 1500 rpm, and the coating was dried, pyrolyzed, and annealed as described above. The sol was then applied again in a thickness of 100 nm by spin coating at 1500 rpm, the coating was dried and pyrolyzed as described above, and the precursor layer was annealed by heating from the substrate side for 5 minutes at an annealing temperature of 650° C. These steps were repeated four times, yielding a piezoelectric thin film having six layers, wherein the combined thickness of the six layers was 1.0 $\mu$m.

Next, a film of iridium was formed on the piezoelectric thin film by DC sputtering, yielding a top electrode with a thickness of 100 nm.

In the piezoelectric thin film element obtained as previously described, the first layer had a rhombohedral crystalline structure with a lattice constant of 4.068 Å. The degree of orientation in (100) plane in the thickness direction of the first layer was 75%, so the orientation was predominantly along the (100) plane. Furthermore, the piezoelectric constant of the obtained piezoelectric thin film element was measured, and it was found that the piezoelectric constant at 25 V was 152 pC/N, yielding favorable piezoelectric properties.

Comparative Example

Except for obtaining a piezoelectric thin film having five layers, a piezoelectric thin film element was obtained in the same manner as is embodiment 1. Specifically, in the comparative example, the sol was applied in a thickness of 100 nm by spin coating at 1500 rpm, dried for 10 minutes at 180° C., and pyrolyzed for 60 minutes at 400° C. The sol was then applied again in a thickness of 100 nm by spin coating under the same conditions, the coating was dried and pyrolyzed in the same manner, and the precursor layer was annealed by heating from the substrate side for 5 minutes at an annealing temperature of 650° C.

These-steps were repeated five times, yielding a piezoelectric thin film having five layers, wherein the combined thickness of the five layers was 1.0 $\mu$m.

In the piezoelectric thin film element obtained as described above, the layer located nearest to the bottom electrode had a rhombohedral crystalline structure with a lattice constant of 4.072 Å. The degree of orientation in the (100) plane was 65% in the thickness direction of the layer. Furthermore, the piezoelectric constant of the piezoelectric thin film element at 25 V was 132 pC/N.

It can be seen by the above results that the piezoelectric thin film element in Example 1 had, in comparison with the comparative example, a fine crystalline structure with a smaller lattice constant for the first layer and a higher (100) plane degree of orientation, and had superior piezoelectric properties as an element.

6. Structure of Second Embodiment

Figure 7A:
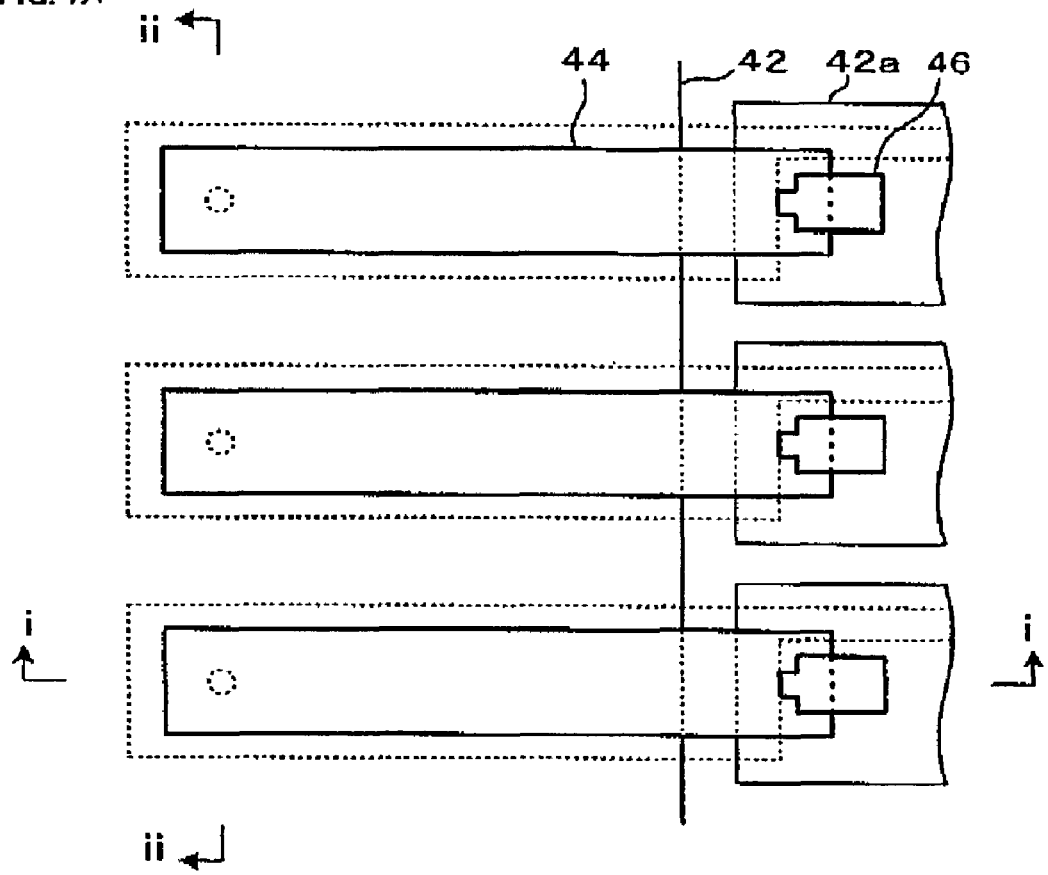
FIG. 7A shows an enlarged plan view of a liquid ejecting head (inkjet recording head), which is a component of the piezoelectric apparatus according to a second embodiment.
Figure 7B:
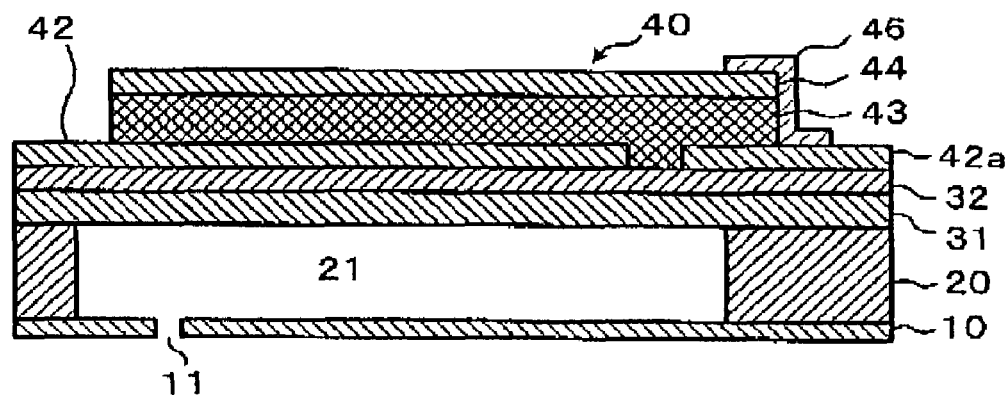
FIG. 7B shows a cross-sectional view along the line i—i in FIG. 7A.
Figure 8:
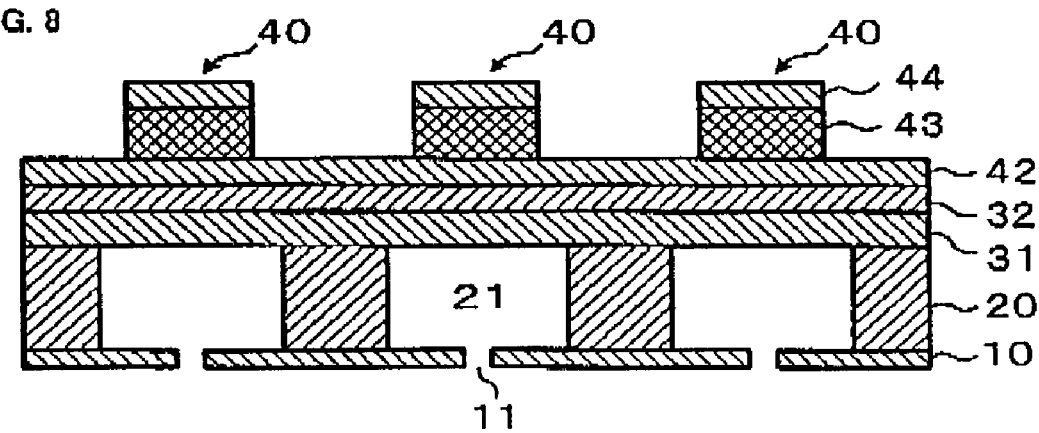
FIG. 8 is a cross-sectional view along the line ii—ii in FIG. 7A.

FIG. 7A shows an enlarged plan view of a liquid ejecting head (inkjet recording head), which is a component of the piezoelectric apparatus according to a second embodiment. FIG. 7B shows a cross-sectional view along the line i—i in FIG. 7A. FIG. 8 is a cross-sectional view along the line ii—ii in FIG. 7A. Identical symbols are used to denote components similar to those in the first embodiment and the explanations thereof are omitted.

As shown in these figures, the piezoelectric element is structured by sequentially stacking the $ZrO_2$ film 32, the bottom electrode 42, the piezoelectric thin film 43, and the top electrode 44 on the insulating film 31. An illustration of the seed Ti film 45 is omitted.

The bottom electrode 42 functions as a common electrode for each piezoelectric element. By contrast, a wiring bottom electrode 42a is placed on a layer of the same height as the bottom electrode 42, but is separated from the bottom electrode 42 or other wiring bottom electrodes 42a, and is capable of conduction with the top electrode 44 via a strip electrode 46. The piezoelectric thin film 43 has a portion formed on the bottom electrode 42 and another portion formed on the exposed diaphragm 30 (on the $ZrO_2$ film 32) from which the bottom electrode 42 has been removed by patterning.

To obtain favorable piezoelectric properties, the portion of the piezoelectric thin film 43 formed on the bottom electrode 42 should preferably have a 100 plane degree of orientation (measured by wide-angle X-ray diffraction) of between 70% and 100%, and more preferably of 80% or greater. Preferably, the 110 plane degree of orientation is 10% or less, and the 111 plane degree of orientation accounts for the remainder. The sum of the 100 plane degree of orientation, the 110 plane degree of orientation, and the 111 plane degree of orientation is equal to 100%.

7. Manufacturing Method of Second Embodiment

Figure 9:
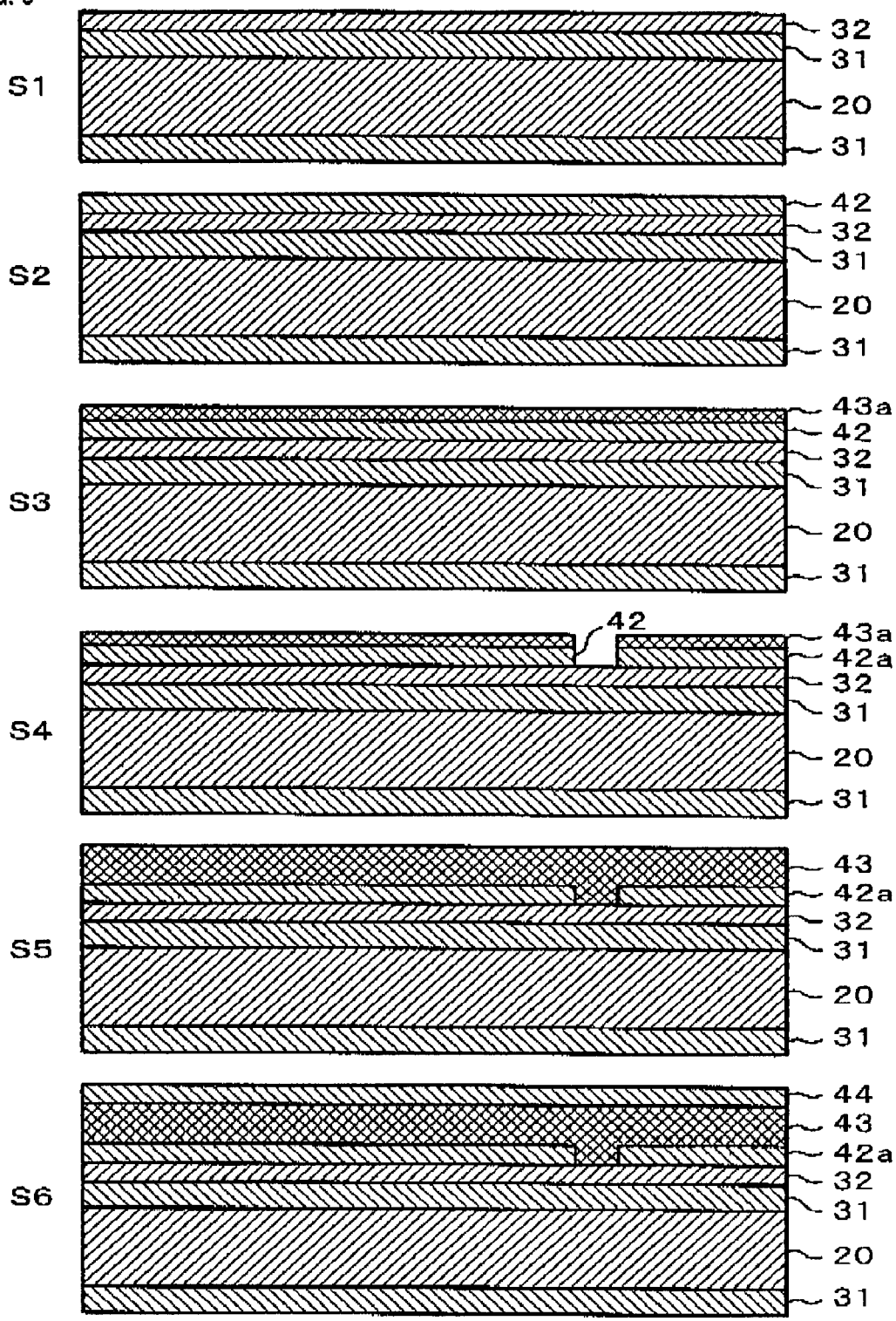
FIG. 9 is a cross-sectional schematic view showing the manufacturing method of a piezoelectric element and a liquid ejecting head (inkjet recording head) of the second embodiment.
Figure 10:
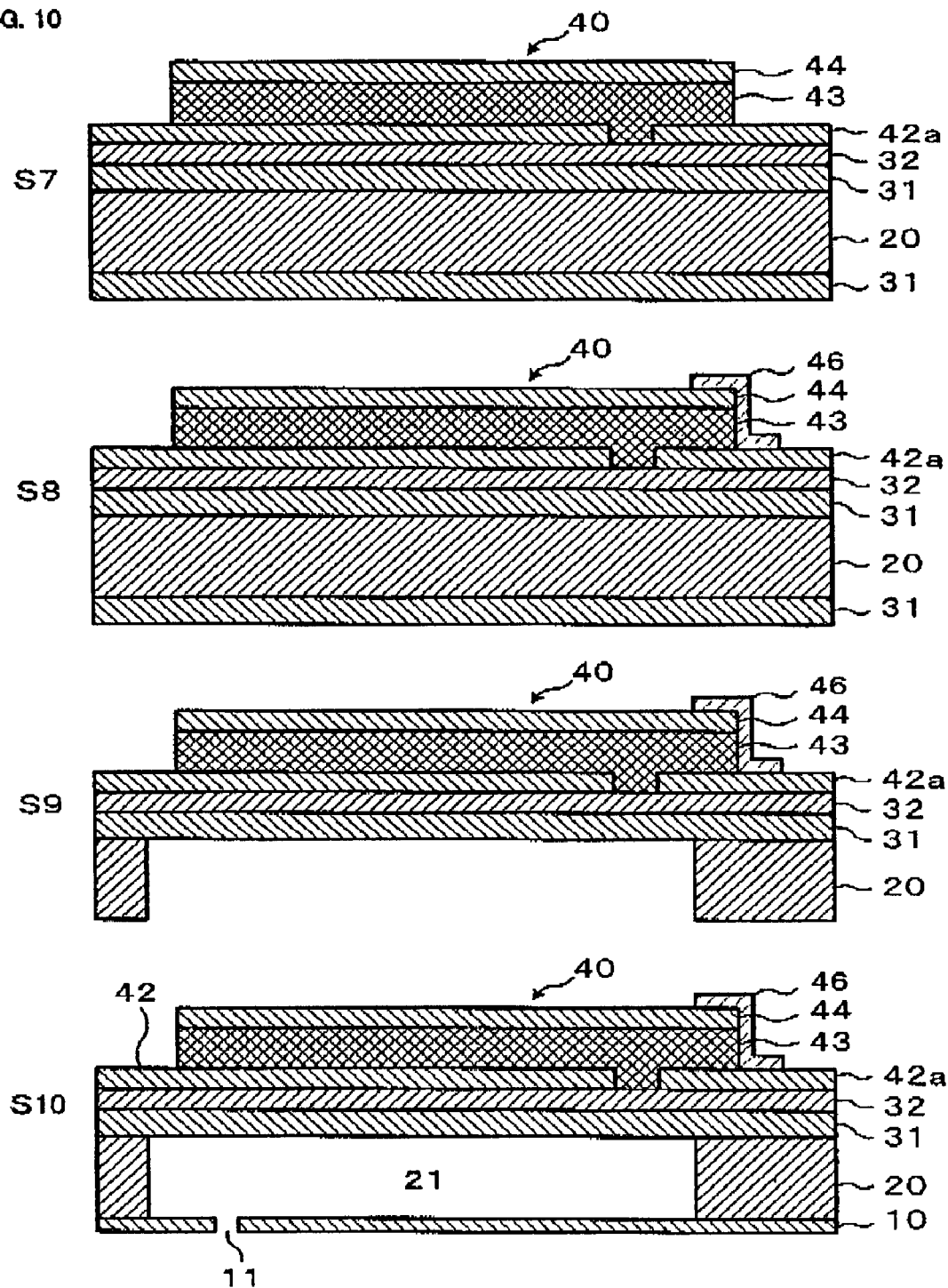
FIG. 10 is a cross-sectional schematic view showing the manufacturing method of a piezoelectric element and a liquid ejecting head (inkjet recording head) of the second embodiment.

Next, the method for manufacturing a piezoelectric element according to the second embodiment is described. FIGS. 9 and 10 are cross-sectional schematic views showing the method for manufacturing a piezoelectric element and a liquid ejecting head (inkjet recording head) of the second embodiment.

Step for Forming the Diaphragm (S1)

An insulating film 31 is formed on a silicon substrate that functions as the pressure chamber substrate 20. The thickness of the silicon substrate may, for example, be about 200 $\mu$m. To manufacture the insulating film, a high-temperature treatment is performed in an oxidizing atmosphere containing water vapor or oxygen, yielding a silicon dioxide ($SiO_2$) film with a thickness of, for example, 1 $\mu$m. In addition to the commonly used thermal oxidation, CVD can also be used.

Furthermore, a $ZrO_2$ film 32 with a thickness of 400 nm is formed on the insulating film 31. The $ZrO_2$ film 32 is obtained by performing a high-temperature treatment in an oxidizing atmosphere on the film formed from a Zr layer by sputtering, vacuum deposition, or other methods.

Step for Forming Bottom Electrode (S2)

Next, a bottom electrode 42 is formed on the $ZrO_2$ film 32. The bottom electrode 42 is formed by a series of steps for forming, for example, an Ir-containing third layer; forming a Pt-containing second layer on the third layer; and forming an Ir-containing first layer on the second layer.

The above-mentioned first through third layers are formed by depositing Ir or Pt on the $ZrO_2$ film 32 by sputtering or the like. Before the bottom electrode 42 is formed, an adhesive layer (not shown) comprising titanium or chromium may be formed by sputtering, vacuum deposition, or other methods.

After the bottom electrode 42 is formed, a Ti layer (nucleus) should preferably be formed in succession on the bottom electrode 42. The Ti layer is formed in a thickness of between 3 nm and 20 nm by sputtering, for example. The Ti layer is formed uniformly over the bottom electrode 42, but it is acceptable to adopt an island shape in some cases.

First Step of Forming Piezoelectric Film (S3)

Next, a piezoelectric film is formed on the bottom electrode 42. In the first step, a first piezoelectric film layer 43a is formed in a thickness less than the desired thickness of the piezoelectric film 43, and preferably less than half the desired thickness thereof. For example, when the piezoelectric film 43 is composed of six layers in a combined thickness of 1.2 $\mu$m, the first piezoelectric film layer 43a comprising at least one layer is formed in a thickness of 0.01 $\mu$m through 0.1 $\mu$m in the first step.

Specifically, a piezoelectric precursor film is formed by a sol-gel process. A sol comprising an organic metal alkoxide solution is applied onto the bottom electrode by spin coating or other coating methods. The coating is then dried at a predetermined temperature for a predetermined time, and the solvent is evaporated. After drying, pyrolyzing is performed at a predetermined temperature for a predetermined time in atmospheric conditions, and organic ligands coordinated to the metal are thermally decomposed to yield a metallic oxide. The piezoelectric precursor film is stacked by repeating the steps of coating, drying, and pyrolyzing a predetermined number of times; for example, twice. As a result of this drying and pyrolyzing treatment, the metal alkoxides and the acetates in the solution form a network of metal, oxygen, and metal after the ligands are thermally decomposed.

Next, the piezoelectric precursor film is crystallized by annealing. As a result of annealing, the piezoelectric precursor film assumes a rhombohedral crystalline structure from an amorphous shape, and is converted to a film exhibiting electromechanical conversion action. The first piezoelectric film layer 43a consisting of a single layer is obtained by forming the above-mentioned piezoelectric precursor film and performing a single annealing step.

The first piezoelectric film layer 43a thus formed is affected by the composition of the bottom electrode 42 and the above-mentioned Ti layer, and the 100 plane degree of orientation is measured at 80% by wide-angle X-ray diffraction. As in the first embodiment, the thickness of the first piezoelectric film layer 43a is less than the thickness of the second layer, so adequate annealing can be achieved, and it is possible to obtain a fine crystalline structure with a lattice constant of 4.070 Å or less.

According to the above-mentioned annealing, part of the bottom electrode 42 is oxidized, and the thickness thereof is increased by diffusing part of the PZT components. In the method in which the piezoelectric film is formed after the bottom electrode has been patterned, the increase of the thickness of the bottom electrode near the patterning boundaries is less than in other portions, and the thickness is therefore not uniform, but since the first piezoelectric film layer 43a is formed before the bottom electrode 42 is patterned in accordance with the method of the present embodiment, the entire thickness of the bottom electrode increases and while remaining uniform.

Step for Patterning Bottom Electrode and Piezoelectric Film (S4)

Next, the first piezoelectric film layer 43a is masked in the desired configuration, the first piezoelectric film layer 43a and the bottom electrode 42 are patterned by etching the periphery thereof, and the wiring bottom electrode 42a is separated from the bottom electrode 42. Specifically, a resist material of uniform thickness is first applied (not shown) onto the first piezoelectric film layer 43a by spinning, spraying, or other methods, and a resist pattern is then formed (not shown) on the piezoelectric film by exposure or development after the mask is formed into a specific configuration. The first piezoelectric film layer 43a and the bottom electrode 42 are etched out by ion etching, dry etching, or other commonly used methods, exposing the $ZrO_2$ film 32.

Next, a Ti layer (nucleus) is formed on the first piezoelectric film layer 43a and the $ZrO_2$ film 32 by sputtering or other methods. The Ti layer preferably has a thickness of between 1 nm and 4 nm. When the thickness of the Ti layer is less than 1 nm, the layer cannot function adequately as a seed layer, and when the thickness is greater than 4 nm, growth of the PZT crystal is stopped at the boundary with the Ti layer, and there is a possibility that the crystal will be discontinuous and that the layers will separate from each other. The Ti layer is more preferably given a thickness of about 2 nm.

Second Step of Forming Piezoelectric Film (S5)

Next, a second step is conducted in which a piezoelectric film of the second layer is formed on the first piezoelectric film layer 43a. In the second step, the step of annealing the piezoelectric precursor film by the same method as in the first step is repeated (for example, five times) until the piezoelectric film achieves the desired thickness, yielding a piezoelectric film 43 with a total thickness of 1.2 µm. In particular, the piezoelectric material of the second layer formed in the second step is formed into a layer with a thickness greater than that of the first layer formed in the above-mentioned first step (for example, between 0.1 µm and 0.3 µm).

Since the piezoelectric film from the second step is formed on the first piezoelectric film layer 43a from the above-mentioned first step, the portion of the piezoelectric film 43 on the bottom electrode 42 consists of a total of six layers, while a total of five layers make up the portion formed on the exposed area of the ZrO$_2$ film 32 from which the first piezoelectric film layer 43a and the bottom electrode 42 have been removed by patterning. Thus, within the piezoelectric film 43 formed by the manufacturing method of the present embodiment, the portion formed on the bottom electrode 42 remaining from patterning is characterized by having a greater number of layers than the portion formed on the diaphragm film 30.

According to the present embodiment, the bottom electrode 42 has already been oxidized, diffused, and increased in overall thickness by annealing in the above-mentioned first step for forming a piezoelectric film, so the thickness of the bottom electrode does not increase any further in the second step for forming a piezoelectric film. Consequently, the thickness of the bottom electrode 42 remains uniform, and the piezoelectric film 43 near the patterning boundaries of the bottom electrode 42 does not crack, nor does the crystal becomes discontinuous in the directions along with the film plane due to variations in thickness of the bottom electrode 42.

As in the first embodiment, the portion of the piezoelectric film 43 on the bottom electrode 42 is affected by the first (bottom) layer 43a of the piezoelectric film, a fine crystal with a low lattice constant is obtained, and a piezoelectric film is formed with a 100 plane degree of orientation of 80%, as measured by wide-angle X-ray diffraction. The portion formed on the exposed area of the ZrO$_2$ film 32 from which the bottom electrode 42 has been removed by patterning is affected by the above-mentioned Ti layer, causing the orientation to be predominantly along the 111 plane.

Furthermore, the thickness of the Ti layer formed following the above-mentioned patterning step (S4) is set to 4 nm or less, whereby the crystalline structure becomes continuous in the thickness direction between the first piezoelectric film layer 43a formed in the first step of forming a piezoelectric film, and the piezoelectric film formed in the second step of forming a piezoelectric film. The layers are less likely to separate from each other, making it possible to obtain a highly reliable piezoelectric film 43.

Step of Forming Top Electrode (S6)

A top electrode 44 is formed on the piezoelectric film 43 by electron beam vapor deposition or sputtering. The top electrode 44 is formed in a thickness of 50 nm using platinum (Pt), iridium (Ir), or other metals.

Step of Removing the Top Electrode and the Piezoelectric Film (S7)

The piezoelectric film 43 and the top electrode 44 are patterned into a specific shape of a piezoelectric element. Specifically, after the top electrode 44 has been spin-coated with a resist, patterning is performed by exposure or development at the location at which the pressure chamber is to be formed. The top electrode 44 and the piezoelectric film 43 are etched by ion milling or the like with the remaining resist as a mask. A piezoelectric element 40 is formed by the step described above.

Step for Forming Strip Electrode (S8)

Next, a strip electrode 46 is formed for ensuring conductivity between the top electrode 44 and the wiring bottom electrode 42a. A metal of low stiffness and electrical resistance is preferably used as the material for the strip electrode 46. Aluminum, copper, or the like are also suitable. The strip electrode 46 is formed in a thickness of about 0.2 µm, and is then patterned such that a conductive section remains between the top electrode and the wiring bottom electrode.

Step for Forming Pressure Chamber (S9)

Next, anisotropic etching, parallel-plate reactive ion etching, or any other types of anisotropic etching featuring an active gas is performed on the surface of the pressure chamber substrate 20 opposite of which the piezoelectric element 40 is formed, yielding a pressure chamber 21. The remaining portion that was not dry-etched forms the side wall 22.

Step of Bonding the Nozzle Plate (S10)

Finally, a nozzle plate 10 is bonded with an adhesive agent to the etched pressure chamber substrate 20. During bonding, each nozzle 11 is positioned so as to be disposed in the spaces of the pressure chambers 21. The pressure chamber substrate 20, to which the nozzle plate 10 is bonded, is attached to the case (not shown), completing an inkjet recording head 1.

8. Other Modifications

The present invention can be modified and used in a variety of ways that do not depend on the above-mentioned embodiments. For example, the piezoelectric element manufactured in the present invention can be used not only in the above-mentioned piezoelectric element of an inkjet recording head, but also in nonvolatile semiconductor storage devices, thin film condensers, pyroelectric detectors, sensors, surface acoustic wave optical waveguides, optical storage devices, spatial light modulators, ferroelectric devices such as frequency doublers for diode lasers, dielectric devices, pyroelectric devices, piezoelectric devices, and electro-optic devices.

In addition to being adapted to a head for ejecting ink used in an inkjet recording apparatus, the liquid ejecting head of the present invention can also be adapted to various heads for injecting liquid, such as heads for ejecting liquids that contain the color materials used in the manufacture of color filters for liquid displays and the like, heads for ejecting liquids that contain the electrode materials used in the formation of electrodes such as organic EL displays or FED (field emission displays), and heads for ejecting liquids that contain the biological material used in the manufacture of biochips.

According to the present invention, using the above-mentioned structure makes it possible to obtain a highly reliable piezoelectric thin film element with superior piezoelectric properties in which the condition of the crystal of the piezoelectric thin film is appropriately controlled, and a manufacturing method thereof, as well as a liquid ejecting head and liquid ejecting apparatus that employ the same.

What is claimed is:

1. A piezoelectric thin film element, comprising:
   a top electrode;
   a bottom electrode patterned in a specific configuration on a diaphragm; and
   a continuous piezoelectric thin film formed between the top electrode and the bottom electrode,
   wherein the piezoelectric thin film comprises:
   at least a first layer located nearest to the bottom electrode, and a second layer that is located nearer to the top electrode than the first layer, and the first and second layers having a varying thickness,
   wherein the piezoelectric thin film is formed both on the patterned bottom electrode and on portions of the diaphragm from which the bottom electrode has been removed, and
   wherein the portion of the piezoelectric thin film on the patterned bottom electrode has a greater number of layers than the portion on the diaphragm from which the bottom electrode has been removed.

2. The piezoelectric thin film element according to claim 1, wherein the thickness of the first layer is not less than 10 nm and not more than 100 nm.

3. The piezoelectric thin film element according to claim 1, wherein the thickness of the second layer is not less than 100 nm and not more than 300 nm.

4. The piezoelectric thin film element according to claim 1, wherein the first layer is composed of a PZT crystal having a rhombohedral crystal structure and a lattice constant of 4.070 Å or less.

5. The piezoelectric thin film element according to claim 4, wherein the PZT crystal is a crystal comprising a solid solution of any one of the following groups:
   lead titanate and lead zirconate;
   lead titanate, lead zirconate and lead magnesium niobate;
   lead titanate, lead zirconate and lead zincate niobate; or
   lead titanate, lead zirconate and lead nickelate niobate.

6. The piezoelectric thin film element according to claim 4, wherein a degree of orientation in (100) plane of the PZT crystal is 70% or greater in the thickness direction of the piezoelectric thin film.

7. A liquid ejecting head, comprising the piezoelectric thin film element according to claim 1 as a piezoelectric actuator for ejecting liquid.

8. A liquid ejecting apparatus, comprising the liquid ejecting head according to claim 7.

9. The piezoelectric thin film element according to claim 1, wherein the second layer has a thickness greater than the thickness of the first layer.

* * * * *